United States Patent [19]

Cuppens et al.

[11] Patent Number: 4,862,418

[45] Date of Patent: Aug. 29, 1989

[54] NON-VOLATILE, PROGRAMMABLE SEMICONDUCTOR MEMORY HAVING REDUCED TESTING TIME

[75] Inventors: Roger Cuppens; Joannes J. M. Koomen, both of Eindhoven, Netherlands

[73] Assignee: U.S. Philips Corp., New York, N.Y.

[21] Appl. No.: 266,346

[22] Filed: Nov. 1, 1988

Related U.S. Application Data

[63] Continuation of Ser. No. 5,516, Jan. 16, 1987, abandoned.

[30] Foreign Application Priority Data

Jan. 20, 1986 [NL] Netherlands ..................... 8600099

[51] Int. Cl.⁴ ..................... G11C 7/00; G11C 11/40; G11C 29/00
[52] U.S. Cl. ..................... 365/201; 365/189.01; 365/230.03; 371/21
[58] Field of Search ............. 365/201, 189, 230; 371/21, 16

[56] References Cited

U.S. PATENT DOCUMENTS

| | | |
|---|---|---|
| 3,944,800 | 3/1976 | Beck et al. ..................... 365/201 X |
| 4,191,996 | 3/1980 | Chesley ..................... 371/21 X |
| 4,393,474 | 7/1983 | McElroy ..................... 365/210 X |
| 4,502,131 | 2/1985 | Giebel ..................... 371/21 X |
| 4,651,304 | 3/1987 | Takata ..................... 365/201 |
| 4,719,599 | 1/1988 | Natsui et al. ..................... 365/201 |
| 4,730,320 | 3/1988 | Hidaka ..................... 371/21 X |
| 4,731,760 | 3/1988 | Maini ..................... 365/201 |
| 4,740,925 | 4/1988 | Kaszubinski et al. ..................... 365/201 X |

Primary Examiner—Stuart N. Hecker
Assistant Examiner—Alyssa H. Bowler
Attorney, Agent, or Firm—Steven R. Biren

[57] ABSTRACT

In programmable memories of the EPROM or EEPROM type, a row and/or column of test memory cells are added to the matrix of rows and columns of non-volatile memory cells for the testing of the peripheral circuits which select and read the memory cells. The test memory cells have a very short write time as compared with the non-volatile memory cells and may be of the dynamic (or volatile) type. The write time for a memory cell of the EPROM or EEPROM may be, for example, 10 msec. The write time for a dynamic memory cell, however, is 100 nsec. The time required for testing the peripheral circuits can therefore be reduced by a factor of 80 (for a 16 Kbit memory) or higher (for memories larger than 16 Kbits).

12 Claims, 1 Drawing Sheet

NON-VOLATILE, PROGRAMMABLE SEMICONDUCTOR MEMORY HAVING REDUCED TESTING TIME

This is a continuation of application Ser. No. 005,516, filed Jan. 16, 1987, now abandoned.

BACKGROUND OF THE INVENTION

The invention relates to a non-volatile, programmable semiconductor memory with at least one matrix of non-volatile, programmable or conventional memory cells, with a row and/or column of test memory cells added to a matrix of memory cells and with peripheral circuits for selecting and reading the test memory cells in test mode and selecting and reading the normally used memory cells in read mode.

A semiconductor memory of the above-mentioned kind is known from IEEE, 1974 Semiconductor Test Symposium, Memory and LSI, 5–7 November, 1974, Cherry Hill, N.J., United States of America, Digest of Papers, pages 87–110, S. Waser: "What is necessary for testing "ROMs" and "PROMs"?". The known semiconductor memory, or more particularly programmable read-only memory, is provided with a matrix of fuse element memory cells and an extra row and column of varyingly pre-programmed test memory cells.

In this type of PROM the matrix of memory cells must be programmed by the user by, in this case, selectively blowing the fuse elements of the memory cells. For that reason, the producer of these PROMs markets them with all the memory cells intact, or in more general terms, with all the memory cells with the same binary value or in the same logical state, which means that selection circuits of this PROM incorporated in the peripheral circuits cannot be tested in conjunction with the memory elements normally used. For this reason, it is necessary to provide the extra column and row of pre-programmed memory cells, in conjunction with which the selection circuits can be tested.

In the case of an electrically or non-electrically erasable, programmable read-only memory, or EEPROM and EPROM, respectively, the addition of test memory cells is fundamentally unnecessary, because it is automatically possible to test the selection circuits.

What has been found in practice, however, is that since the duration of a test of the selection circuits is determined by the programming time for the memory cells (comparable with the memory cells of the known PROM described above) on, for example, the diagonal of the matrix of memory cells, this duration for the testing of the selection circuits determines the total test time of the semiconductor memory. The addition of (E)EPROM test cells is therefore not a solution since programming then still takes too long.

SUMMARY OF THE INVENTION

The object of the invention is to improve the known semiconductor memory, mentioned above, which according to the invention can then also be an EPROM or an EEPROM, in such a way that the total test time is no longer essentially determined by the test time for the selection circuits.

For this purpose the invention provides for a semiconductor memory of the kind mentioned above, characterized in that the peripheral circuits are equipped for writing the test memory cells in test mode and in that the test memory cells are of a type with a shorter write time than that of the memory cells normally used.

The invention therefore proposes the use of test memory cells of a different memory cell type which can be written rapidly compared with conventional memory cells, instead of pre-programmed test memory cells. In the case of a read-only memory to be erased test memory cells of the invention are used, instead of test memory cells with the same write time as that of the memory cells normally used. As a result, the test time for the selection circuits is reduced to only a fraction of the total test time.

BRIEF DESCRIPTION OF THE DRAWING

Embodiments of the invention will now be explained in detail by way of example with reference to the drawing, in which.

DESCRIPTION OF THE PREFERRED EMBODIMENTS

Figure 1:
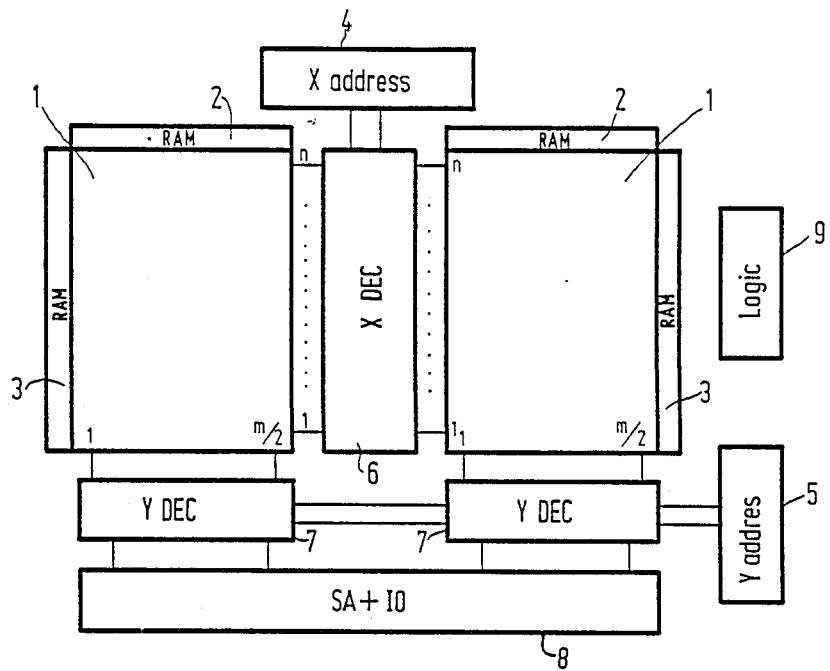
FIG. 1 shows a block diagram of a semiconductor memory according to the invention.

FIG. 1 shows a non-volatile, programmable semiconductor memory, for example, a programmable read-only memory (PROM), an electrically programmable semiconductor memory erasable with UV light (EPROM) or an electrically erasable, electrically programmable read-only memory (EEPROM), of for example two Kbytes, in which the nonvolatile programmable or conventional memory cells each contain an electrically programmable MOS transistor with a floating gate and are distributed over two matrices, each with the same number of rows and columns, also sometimes called half memory matrices. It will be clear that the invention can also be used on semiconductor memories with a smaller or larger number of normally used memory cells such as, for example, a semiconductor memory of 32 Kbytes with four quarter matrices.

In FIG. 1, the half matrices are indicated with the reference number 1. Each half matrix 1 is filled with a row 2 and column 3 of test memory cells, which will be explained later with reference to FIGS. 2–4. What is important, is the fact that the test memory cells can be written faster than the memory cells normally used. The write time for a conventional memory cell in an EPROM is, for example 10 ms. According to the invention, volatile memory cells are taken for the test memory cells, for example, of the dynamic random access type, or DRAM type, with a write time of, for example, 10 ns.

Static test memory cells can also be used, in so far as these are compatible with, for example, the type of sense amplifier and the organization of the method of selection. If they are not, adaptation devices and measures must be provided.

In the semiconductor memory in FIG. 1, the row 2 and column 3 of test memory cells are adjacent, respectively, to the last row and column of a respective matrix of memory cells, viewed from the selection circuits still to be discussed. This is preferable as compared with positioning adjacent to the first row and/or column of the matrix of memory cells at the side of the selection circuits, for then during the test of the selection circuits defects such as interruptions and short circuits in word or bit lines of the matrix of memory elements can also be determined if required. This preferred arrangement of the row 2 and column 3 of test memory cells is not always possible, however, since this depends on the construction of the RAM cells, particularly with regard to the row or rows of RAM cells, but this aspect will be returned to later.

The selection circuits comprise X and Y address circuits, respectively 4 and 5, and respective X and Y decoding circuits, respectively 6 and 7. Depending on the number of matrices or sub-matrices 1 the decoding circuits 6 and 7 are divided into sub-decoding circuits, which work in conjunction with a respective sub-matrix 1, or are common for a number of sub-matrices 1. In the present example the Y decoding circuit 7 is divided into two sub-circuits, while the X decoding circuit 6 is common for the two half matrices.

In addition, the semiconductor memory in FIG. 1 contains sense or read amplifiers and input/output gates 8, as well as logic circuits 9, all of which are also part of the on-chip peripheral circuits. The logic circuits 9 provide for signals, for example, for the activation of the semiconductor memory, the activation of the output gates and for programming or write signals.

Finally, provision is made for connections (not shown) for supply and bias or reference voltages (ground potential), data input and output, address signals and control signals.

If the memory in FIG. 1 is "byte" or word-organized, the writing of a data byte, or a data word of 8 bits, in a non-volatile, programmable memory takes 10 ms, which leads to the time required for subjecting the semiconductor memories to a reliability test after production being fairly great, as a result of which the costs of testing the semiconductor memories contribute substantially to the cost of these semiconductor memories. This is the reason that at present in designing, for example, EEPROMs various test possibilities are incorporated, such as the simultaneous writing of all bytes, the simultaneous erasure of all bytes and the writing of a so-called checkerboard pattern in two write cycles, followed each time by the byte-by-byte reading of the semiconductor memory. This makes it possible to test the memory cells as such with a limited number of write cycles, for example 6. Since the byte read time is much shorter than the byte write time, for example 100 ns and 10 ms, respectively, the total write time—in the example mentioned 60 ms—is decisive for the time required for testing the memory cells normally used. Then the selection circuits still have to be tested for reliability. This can be done by writing the memory cells which are located on a diagonal of the matrix of normally used memory cells, in which respect the remaining cells are kept in the erased state, the so-called diagonal test. The number of write cycles required for carrying out the diagonal test is at least one times the number of rows, or word lines, in the matrix of memory elements. If the semiconductor memory does not have a so-called page mode, in which all the cells are written simultaneously on a word line, then the number of write cycles required is twice the number of word lines. Here it is in fact possible to program the memory cells marginally, for example, in 2 ms instead of 10 ms. In the case of a two Kbyte semiconductor memory without the test memory cells according to the invention this would take 128×2 ms=256 ms in the most advantageous case, which shows that the time required for testing the selection circuits (256 ms) determines virtually the total test time (316 ms=256 ms+60 ms) since the time required for testing the memory cells, as explained above, amounts to, for example, 60 ms. According to the invention, the total test time can now be significantly shotened by reducing the test time for the selection circuits, as a result of which the test time for the memory cells determines the total test time for the semiconductor memory. This will be further explained below.

The test memory cells, for example RAM cells, can be written in a very short time of, say, 100 ns. To permit the selection circuits to be tested, the test memory cells must of course be selected by the same selection circuits as the memory cells in the matrix or sub-matrix or matrices. In addition, the test memory cells must be read and written in separate test mode and during the normal memory cycles, particularly in reading, must not adversely affect the operation of the semiconductor memory.

In the embodiment of the semiconductor memory according to the invention shown in FIG. 1 an extra RAM cell is added at the ends of each word line and each bit line, that is, two columns and two half rows of RAM cells. In more general terms, 2 n+m RAM cells are added to a semiconductor memory with n×m cells with a total of n rows and m columns in two sub-matrices.

For preference, the test memory cells for writing and reading are adapted to the existing sense amplifiers in the output buffers 8 and selection circuits so that testing can take place via the existing sense amplifiers and input/output buffers 8. It is also possible to add extra sense amplifier circuits to the on-chip peripheral circuits.

The number of write and read cycles for the test memory cells in the test mode, which is required in order to test the selection circuits, depends on the number of available input/output gates in 8, on the configuration of the memory matrix 1 and on the construction of the selection circuits themselves, particularly on their decoding circuits 6 and 7.

An example of a very extensive test of the selection circuits will now be described, assuming that the memory cells normally used, particularly the memory transistors, are not active, that there are eight input/output gates in 8 and that the two columns of test memory cells are connected to various input/output amplifiers in 8.

In a first step a background is written, that is, a "0" in the two columns 3 of test memory cells in n cycles. In a second step a word line is selected and a "1" is written in one cycle. In a third step of n cycles the two columns 3 of test memory cells are read. Then in a fourth step a "0" is rewritten in the written cells in one cycle. Next, in a fifth step, the steps 2 to 4 inclusive are repeated for each word line, in other words n times. After that, in step 6, steps 1 to 5 inclusive are repeated, with "0" being replaced by "1" and vice versa. Finally, in step 7, steps 1 to 6 inclusive are repeated, but now for the two half rows 2 of test memory cells. In this connection it is pointed out that in step 7 reading and writing take place simultaneously via the 8 input/output gates, so that for the calculaton of this part of the test time the number of columns 3 must be divided by 8.

If it is assumed that both the write time and the read time for the test memory cells is 100 ns, then for two matrices of memory cells with a total of n rows and m columns the seven-step test described above takes $(2(n+(n+2)n)+2(m/8+(m/8+2)m/8)).100$ ns $= (2(n+3)n+2(m/8+3)m/8).100$ ns. In the case of a memory of 16 Kbits, particularly 2Kbytes, in which n=m=128, the testing of the selection circuits therefore takes about 3.3 ms. This is not only significantly less than the 256 ms or so for the diagonal test discussed above without the test memory cells according to the invention, but also significantly less than the duration of the test of the memory cells in themselves, namely 60 ms, so that the total test time is virtually determined by the test time for the memory cells themselves.

As already mentioned, the test memory cells are of the volatile type. The test memory cell of the RAM type can be a cell with a memory transistor, write selection transistor and read selection transistor, hereinafter to be called write and read transistor, respectively, and is generally designed in a MOS technique. In the following examples the test memory cell has one or two extra transistors, which will be called auxiliary selection transistors. This will be further explained on the basis of FIGS. 2-4.

Figure 2:
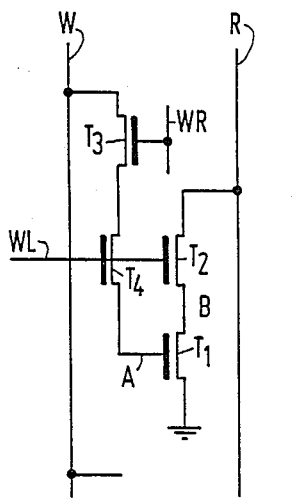
FIGS. 2–4 show various embodiments of the test memory cells in a semiconductor memory according to the invention.

FIG. 2 shows a first embodiment of a DRAM cell with a memory transistor T1, a read transistor T2, a write transistor T3 and an auxiliary selection transistor T4. As shown, the memory transistor T1 is grounded on one side or connected to a bias voltage level, the read transistor T2 is connected with a first main electrode to the second main electrode of the memory transistor T1 and the write transistor T3 is connected via auxiliary selection transistor T4 with a first main electrode to the gate of the memory transistor T1. The second main electrode of the read transistor T2 is connected to a read data line or, for short, read line R and the gate is connected to a test selection line WL. The second main electrode of the write transistor T3 is connected to a write data line or, for short, write line W and the gate is connected to a write selection line WR. The above-mentioned lines, in other words the read and write line and the test and write selection line, are connected to the peripheral circuits 4-9 in FIG. 1.

According to the invention, as already mentioned, an auxiliary selection transistor T4 is incorporated in the DRAM cell in the connection between the first main electrode of the write transistor T3 and the gate of the memory transistor T1, the gate of the said auxiliary selection transistor T4 being connected to the test selection line WL.

Before describing the operation of the embodiment of a DRAM cell according to the invention and as shown in FIG. 2, the demands which can be made on the test memory cells will first be discussed.

Fast reading and writing of the test memory cells must be possible and the reading of the test memory cells must, for preference, take place in the same way as the reading of the memory cells normally used. The test memory cell must be able to retain the bit read in for a sufficient time, for example, longer than 1 ms. It is advantageous if the reading of the test memory cell is non-destructive. The test memory cell must fit in with the technology of non-volatile, programmable semiconductor memories. It must be possible to design the test memory cells in such a way that they correspond to the pitch of the memory cells normally used. Finally, it must be possible to connect the test memories in such a way that they do not affect the writing and, in particular, the reading of the memory cells normally used.

Needless to say, the above requirements apply to an optimum test memory cell, so that in a practical case, in which a compromise is aimed at, one or more of the above-mentioned requirements need not be satisfied.

The data stored in a non-volatile, programmable semiconductor memory are read by detecting whether or not current is flowing through the respective memory elements, which for EPROMs and EEPROMs means that the respective memory transistor is either conductive or not. For that reason a DRAM cell, which operates according to the principle outlined above, it is a very suitable memory cell which can be considered for use as a test memory cell. The DRAM cell in FIG. 2 according to the invention can satisfy all the above-mentioned requirements. The operation of the DRAM cell in FIG. 2 will now be described in greater detail. The test selection line WL of the DRAM cell in FIG. 2 is connected to the output of the respective decoding circuit 6 or 7 in FIG. 1. The write line W and the write selection line WR of the DRAM cell are connected as auxiliary control lines to the peripheral circuits in FIG. 1 in order to permit the DRAM cell to be written. The read line R of the DRAM cell can be connected via a drive transistor to one of the sense amplifiers in 8 in FIG. 1. The read line can also consist of a respective bit line of the matrix of memory cells normally used. If the test meory cell in FIG. 2 is incorporated in a column, then the first possibility mentioned should be applied, for otherwise this bit line would constitute an undesirably high capacitive load for the respesive sense amplifier compared with the capacitive load of the other bit lines for this sense amplifier, while when the test memory cell is incorporated in a row the last-mentioned possibility can be incorporated, since the capacitive load effect mentioned does not occur there because there is only one test memory cell per bit line.

If the existing bit line is used, read transistor T2 can be omitted and the second, non-grounded main electrode of the memory transistor T1 can be connected directly to the bit line, since this is already connected via bit a line selection transistor (in fact, constituting read transistor T2) to the respective sense amplifier in the peripheral circuits of the non-volatile, programmable semiconductor memory (FIG. 1).

During the normal read cycles (PROM, EPROM, EEPROM) and write cycles (EPROM and EEPROM) of the memory cells normally used, the write line W is kept at 0 volt and the write selection line WR is kept at a supply voltage level (Vcc), so that the voltage at the gate of the memory transistor T1 is equal to 0 volt, and the memory transistor T1 blocks and has no effect on the normal operation of the non-volatile, programmable semiconductor memory. In test mode the selected memory cell, i.e. when the supply voltage Vcc is applied to the test selection line WL, can be written by applying the write selection line WR to Vcc. Depending on the voltage on the write line W, the gate of the memory transistor T1 is discharged or charged up to a maximum of the supply voltage minus the threshold voltage. If the supply voltage of the write selection line WR is removed and the write selection line WR is again connected to 0 volt, then the voltage at the gate of the memory transistor T1 will not change in any case because the gate capacity of the memory transistor T1 is charged and retains this charge. Depending on the voltage at the gate of the memory transistor T1, which is either conductive or blocked, a "1" or a "0" can be read via the read line R during the read cycle following the write cycle.

Figure 3:
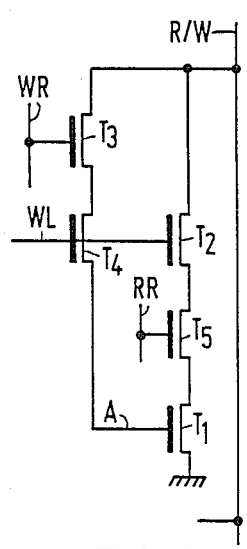

The DRAM cell in FIG. 3 operates according to the same principles as that in FIG. 2, but the embodiment in FIG. 3 differs from that in FIG. 2 in that the read line R and the write line W are combined in a single read/write line R/W. Provision is also made for a second auxiliary selection transistor T5 which is incorporated in the connection between the memory transistor T1 and the read transistor T2 and the gate of which is connected to an auxiliary selection line RR. For the rest, the same reference symbols as in FIG. 2 indicate the same elements in FIG. 3.

The operation of the DRAM cell in FIG. 3 according to the invention will now be described in greater detail. The test memory cell in FIG. 3 is read and written via the read:write line R/W. During a normal memory cycle, more particularly in read mode, the auxiliary selection line RR is kept at 0 volt, so that it does not matter whether the write selection line WR is connected to the supply voltage or has a voltage level of 0 volt. In the test mode, in the case of a write cycle, the supply voltage Vcc and a voltage of 0 volt are applied to the write selection line WR and the auxiliary selection line RR, respectively, while in the case of a read cycle a voltage of 0 volt and the supply voltage Vcc are applied to the write selection line WR and the auxiliary selection line RR, respectively.

Both the test memory cell in FIG. 2 and that in FIG. 3 have an auxiliary selection transistor T4 in the write section, so that when such a test memory cell is incorporated in the row added to the matrix of non-volatile, programmable or normally used memory cells, this must be positioned as close as possible to the output of the respective column decoding circuit 7 in FIG. 1, which can create layout problems.

Figure 4:
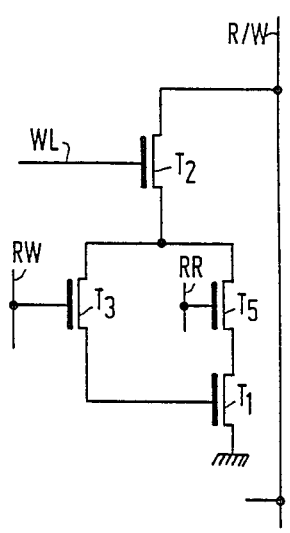

These problems can be avoided by means of the DRAM cell shown in FIG. 4, because this test memory cell can be placed in a row 2 (FIG. 1) adjacent to the "last" row of the matrix of normally used memory cells, or at the end of the half memory matrices 1 in FIG. 1 turned away from the column decoding circuits 7 (FIG. 1).

An advantage of this method of positioning the row 2 of test memory cells (FIG. 1) and, of course, also that of the column 3 of test memory cells (FIG. 1) is that during testing, either word lines of the selection circuits are measured at that same time, or defective, for example, broken bit lines or word lines are present in the semiconductor memory.

If the DRAM cell in FIG. 4 is a test memory cell of a row 2 in FIG. 1, then the read transistor T2 must be omitted since this is already present in the memory circuit and the connection between the write transistor T3 and the auxiliary selection transistor T5 must be connected to the existing bit line.

For the rest, the operation of the DRAM cell in FIG. 4 is the same as that in FIG. 3.

A characteristic of the test memory cell in FIG. 4 according to the invention is that, depending on the voltage on a non-selected bit line, after a selection and read cycle the stored information can be destroyed in the next write cycle because the capacity of the bit line is much greater than that of the gate of the memory transistor T1. This can be overcome by also rewriting the background for every write cycle. As a result, the time required for testing the selection circuits will approximately double. By using the test memory cell in FIG. 4 only for a row 2 in FIG. 1, however, the need for rewriting the background can be limited to the test of the column decoding circuits 7 in FIG. 1. In accordance with the embodiment of the semiconductor memory in FIG. 1 already discussed, this means a number m/8(m/8−1) of extra write cycles, which in the numerical example also discussed above means an extra test time of 25 μs. This is negligible compared with the total test time of 3.3 ms for the selection circuits.

What is claimed is:

1. A non-volatile, programmable semiconductor memory with at least one matrix of non-volatile memory cells, comprising at least one of a row and a column of test memory cells added to said matrix of memory cells, and on-chip peripheral circuits for selecting and reading the test memory cells in a test mode and selecting and reading the memory cells in a read mode, wherein the peripheral circuits comprise means for writing the test memory cells in the test mode and the test memory cells are of a type different from that of said memory cells and having means for providing a shorter write time than that of the memory cells.

2. A semiconductor memory according to claim 1, in which the peripheral circuits are provided with a column decoding circuit and a row decoding circuit, wherein the at least one of said row and column of test memory cells is adjacent to an at least one of the last row and column of the matrix of memory cells, respectively, as seen from the column decoding circuit and the row decoding circuit, respectively.

3. A semiconductor memory according to claim 1 or 2, characterized in that the test memory cells are of the volatile type.

4. Semiconductor memory according to claim 1 or 2, characterized in that the test memory cells are of the dynamic random access type.

5. A semiconductor memory according to claim 1 or 2, characterized in that the test memory cell comprises a memory transistor with a first main electrode connected to a bias voltage level, a read transistor with a first main electrode connected to the second main electrode of the memory transistor and a write transistor with a first main electrode connected to the gate of the memory transistor, the second main electrode of said read transistor being connected to a test read line and its gate being connected to a test selection line, and the second main electrode of said write transistor being connected to a write line and its gate being connected to a write selection line, which lines ae connected to the peripheral circuits.

6. A semiconductor memory according to claim 5, characterized in that an auxiliary selection transistor is incorporated in the connection between the first main electrode of the write transistor and the gate of the memory transistor, the gate of said auxiliary selection transistor being connected to the test selection line.

7. A semiconductor memory according to claim 6, characterized in that the read line and the write line are combined in the read/write line of the matrix of memory cells and in that a second auxiliary selection transistor is incorporated in the connection between the first main electrode of the read transistor and the second main electrode of the memory tansistor, the gate of said second auxiliary selection transistor being connected to an auxiliary selection line connected to the peripheral circuits.

8. A semiconductor memory according to claim 5, characterized in that the test selection line is a respective selection line of the matrix of said memory cells.

9. A semiconductor memory according to claim 5, characterized in that the read line is a respective bit line of the matrix of said memory cells and in that the read transistor is incorporated in the peripheral circuits.

10. A semiconductor memory according to claim 5, characterized in that the read line is a read/write line and in that an auxiliary selection transistor is incorporated in the connection between the first main electrode of the read transistor and the second main electrode of the memory transistor, the gate of said auxiliary selection transistor being connected to an auxiliary selection line connected to the peripheral circuits.

11. A semiconductor memory according to claim 10, characterized in that the inputs of the read transistor and the auxiliary selection transistor are connected to the bit line of the matrix of memory cells and in that the selection transistor is incorporated in the peripheral circuits.

12. Semiconductor memory according to claim 1 or 2, characterized in that each of the memory cells comprises an electrically programmable transistor with a floating gate.

* * * * *